US 6,538,359 B1

United States Patent
Hiraku et al.

(10) Patent No.: US 6,538,359 B1
(45) Date of Patent: Mar. 25, 2003

(54) SURFACE ACOUSTIC WAVE DEVICE

(75) Inventors: Tatsuya Hiraku, Hamamatsu (JP);
Masao Imanishi, Hamamatsu (JP);
Akira Kaneko, Hamamatsu (JP);
Yukitoshi Suzuki, Hamamatsu (JP);
Masuhiro Okada, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 0 days.

(21) Appl. No.: 09/531,353

(22) Filed: Mar. 20, 2000

(30) Foreign Application Priority Data

Mar. 24, 1999 (JP) .......................... 11-080553

(51) Int. Cl.[7] .................... H01L 41/04; H01L 41/08; H01L 41/18

(52) U.S. Cl. .................................. 310/313 R

(58) Field of Search ............................ 310/313 R, 311, 310/313 A

(56) References Cited

U.S. PATENT DOCUMENTS

| | | | | |
|---|---|---|---|---|
| 5,576,589 A | * | 11/1996 | Dreifus et al. ........... | 310/313 A |
| 5,576,879 A | * | 11/1996 | Nashimoto .................. | 359/248 |
| 6,194,808 B1 | * | 2/2001 | Yamanouchi et al. ... | 310/313 R |

FOREIGN PATENT DOCUMENTS

| JP | 64-62911 | 3/1989 |
|---|---|---|
| JP | 10-32464 | 2/1998 |
| JP | 10-65488 | 3/1998 |

(List continued on next page.)

OTHER PUBLICATIONS

Yamanouchi, Odagawa, Kojima and Cho, 1998, Research Institute of Electrical Communication, Tohoku University, Sendai 980–8577, Japan.*
The above listed reference was cited in a Japanese Office Action issued Jan. 23, 2001 in a related application.

(List continued on next page.)

*Primary Examiner*—Lynn D. Feild
*Assistant Examiner*—Michael C. Zarroli
(74) *Attorney, Agent, or Firm*—Dickstein, Shapiro, Morin & Oshinsky, LLP.

(57) ABSTRACT

A surface acoustic wave device (e.g., filter or convolver) is designed to increase an electromechanical coupling factor $K^2$ and is basically configured by a substrate, a buffer layer, a piezoelectric layer and an electrode layer. Herein, the substrate is made of a bulk material (e.g., $SrTiO_3$), which allows growth of a perovskite compound crystal being expressed by a general chemical formula of $SrZO_3$ (where Z denotes an element such as Zr and Sn whose valence is 4). The buffer layer is formed on the substrate and is made of the perovskite compound crystal (e.g., $SrZrO_3$, $SrSnO_3$), which has good lattice matching with $KNbO_3$. The piezoelectric layer is made of a $KNbO_3$ single crystal and is formed on the buffer layer with a thickness of 500 nm or so. The electrode layer is formed on or below the piezoelectric layer. An interdigital transducer consisting of input and output electrodes is formed by patterning using photolithography technique being effected on the electrode layer, which is made of a metal material (e.g., Al). In addition, it is possible to form a temperature stabilization layer between the piezoelectric layer and electrode layer. The temperature stabilization layer is made of a material ($SiO_2$) having a temperature coefficient reverse to a temperature coefficient of the piezoelectric layer so as to ease distortion being caused to occur due to differences in thermal expansion between the piezoelectric layer and electrode layer. Incidentally, the temperature stabilization layer has a prescribed thickness, which is approximately 1000 nm.

21 Claims, 10 Drawing Sheets a=5.695Å
b=5.721Å
c=3.974Å

FOREIGN PATENT DOCUMENTS

| JP | 10-200371 | 7/1998 |
|---|---|---|
| JP | 10-276059 | 10/1998 |
| JP | 10-276060 | 10/1998 |

OTHER PUBLICATIONS

K. Yamanouchi, et al., "Surface Acoustic Wave Substrate With Super High Electro–Mechanical Couplings Using $KNbO_3$ Single Crystal", *No. 150 Symposium for SAW Techniques in Japan Academy Promotion Society*, report of research No. 50, Nov. 27, 1996, pp. 27–31.

"Growth of Nonlinear Optical Crystal Films for SHG Devices by Vapor Phase Deposition", *Pioneer R&D*, vol. 7, No. 1, pp. 8–12.

C–H. Cheng, et al., "The Growth of Single Crystal–Like and Polycrystal $KNbO_3$ Films Via Sol–Gel Process", *Mat. Res. Soc. Symp. Proc.*, vol. 271, 1992 Materials Research Society, pp. 383–388.

Operation manual of the vector network analyzer (HP8752C), (discussed on p. 27 of the specification), pp. 6–1–6–3.

* cited by examiner

| | FILM CONFIGURATIONS | FILM THICKNESS (nm) KNbO3 LAYER / BUFFER LAYER | K² (%) | IL (db) |
|---|---|---|---|---|
| SAMPLE 1 | KNbO3(010)/SrSnO3/SrTiO3 (110) | 500/100 | 10 | 10 |
| SAMPLE 2 | KNbO3(001)/SrSnO3/SrTiO3 (100) | 500/100 | 15 | 8 |
| SAMPLE 3 | KNbO3(010)/SrZrO3/SrTiO3 (110) | 500/100 | 8 | 12 |
| SAMPLE 4 | KNbO3(010)/SrMoO3/SrTiO3 (110) | 500/100 | 8 | 12 |
| SAMPLE 5 | KNbO3(010)/SrHfO3/SrTiO3 (110) | 500/100 | 8 | 12 |
| SAMPLE 6 | KNbO3(010)/SrTiO3/SrTiO3 (110) | 500/100 | 6 | 18 |
| SAMPLE 7 | KNbO3(001)/SrSnO3/MgO (100) | 500/100 | 8 | 12 |
| SAMPLE 8 | KNbO3(001)/SrSnO3/Pt (100) | 500/100 | 8 | 12 |
| SAMPLE 9 | KNbO3(010)/SrSnO3/Al2O3 (1-102) | 500/100 | 5 | 20 |
| SAMPLE 10 | KNbO3(001)/SrSnO3/GaAs (100) | 500/100 | 6 | 18 |
| SAMPLE 11 | KNbO3(010)/SrSnO3/Si (110) | 500/100 | 6 | 18 |
| COMPARATIVE SAMPLE 1 | KNbO3(010)/SrTiO3 (110) | 500/0 | 4 | 28 |
| COMPARATIVE SAMPLE 2 | KNbO3(001)/SrTiO3 (100) | 500/0 | 10 | 10 |
| COMPARATIVE SAMPLE 3 | KNbO3(010)/CaZrO3/SrTiO3 (010) | 500/100 | 1 | 30 |
| COMPARATIVE SAMPLE 4 | KNbO (010)/BaTiO3/SrTiO3 (010) | 500/100 | 1 | 30 |
| COMPARATIVE SAMPLE 5 | KNbO (010)/PbTiO3/SrTiO3 (010) | 500/100 | 1 | 30 |
| COMPARATIVE SAMPLE 6 | KNbO3(010)/SrSnO3/QUARTZ GLASS | 500/100 | UNMEASURABLE | |

FIG. 10

| | FILM CONFIGURATIONS | FILM THICKNESS (nm) TEMPERATURE STABILIZATION LAYER / KNbO₃ LAYER / BUFFER LAYER | $K^2$ (%) | IL (db) | TCF (ppm/°C) |
|---|---|---|---|---|---|
| SAMPLE 12 | SiO₂ (AMORPHOUS) /KNbO₃(010)/ SrSnO₃/SrTiO₃ (110) | 1000/500/100 | 10 | 10 | −20 |
| COMPARATIVE SAMPLE 7 | KNbO₃(010)/SrSnO₃/SrTiO₃ (110) | 0/500/100 | 10 | 10 | −150 |

FIG. 11

SURFACE ACOUSTIC WAVE DEVICE

BACKGROUND OF THE INVENTION

1. Field of the Invention

This invention relates to surface acoustic wave devices such as filters and convolvers using special effects of surface acoustic waves, and particularly to surface acoustic wave devices that use $KNbO_3$ single crystals having superior electromechanical coupling factors as piezoelectric layers.

This application is based on Patent Application No. Hei 11-80553 filed in Japan, the content of which is incorporated herein by reference.

2. Description of the Related Art

In general, surface acoustic wave devices convert electric signals to surface acoustic waves propagating on surfaces of elastic substances, so that signals of specific frequencies are being extracted. Since scientists and engineers have discovered that surface acoustic waves can be subjected to excitation and signal reception efficiently on a piezoelectric substrate, they have studied and developed a variety of applications for signal function components such as filters and convolvers using the superior properties of surface acoustic waves, which are not provided by electromagnetic waves. So, the surface acoustic wave devices are used in a wide variety of fields in practice. Conventionally, the surface acoustic wave devices are manufactured by forming interdigital transducers, which function by transduction between electric signals and surface acoustic waves, on piezoelectric single crystals made of $LiNbO_3$, $LiTaO_3$, etc.

The surface acoustic wave device is designed such that an operational frequency f is determined based on an acoustic velocity v of surface acoustic waves propagating on a surface of an elastic substance and an electrode width w of an interdigital transducer in accordance with an equation (1), as follows:

$$f = \underline{v} = \frac{y}{4w} \quad (1)$$

where is a wavelength of a surface acoustic wave.

That is, as the electrode width w becomes small while the velocity v becomes large, the surface acoustic wave device can be used in higher frequencies. In order to obtain higher frequencies of a gigahertz order which is needed in future communications fields, however, it is necessary to select specific materials for elastic substances which allow propagation (or transmission) of surface acoustic waves at higher velocities because the present manufacturing techniques have limits in further narrowing electrode widths. An example of the material allowing propagation of acoustic waves at a high velocity is diamond. Japanese Unexamined Patent Publication No. Sho 64-62911 discloses an example of a surface acoustic wave device having a laminated structure in which a piezoelectric layer and an electrode layer are sequentially formed on a diamond layer.

Another factor which is required for selection of the material used for the surface acoustic wave device is an electromechanical coupling factor $K^2$ representative of a capability of transduction between electric signals and surface acoustic waves. That is, it is necessary that the selected material has a large electromechanical coupling factor $K^2$. As $K^2$ becomes large, it is possible to obtain a surface acoustic wave device having a higher efficiency in transduction. From this point of view, the scientists and engineers have discovered that $KNbO_3$, which is conventionally known as a ceramic material having piezoelectric properties, has an extremely large electromechanical coupling factor $K^2$. Such a fact is confirmed through experiments. That is, results of the experiments show that a $KNbO_3$ single crystal has a larger value of $K^2$ than $LiNbO_3$, which is conventionally believed to have a large electromechanical coupling factor $K^2$. In particular, the $KNbO_3$ single crystal at a specific crystal plane (e.g., plane (001)) in a specific direction (e.g., [100]) has an electromechanical coupling factor $K^2=0.053$, which is approximately ten times greater than $K^2=0.055$ in $LiNbO_3$. This is disclosed in a monograph entitled "Surface Acoustic Wave Substrate with Super High Electro-Mechanical Couplings Using $KNbO_3$ Single Crystal" written in a report of research no. 50 on pp. 27–31 (published on Nov. 27, 1996), which is provided for the No. 150 Symposium for SAW techniques at the Japan Academy Promotion Society. Reference is made to Japanese Unexamined Patent Publication No. Hei 10-65488, which discloses a surface acoustic wave substrate using potassium niobate ($KNbO_3$) to obtain $K^2=0.5$.

In addition, some documents disclose techniques for formation of $KNbO_3$ thin films which are not always related to techniques of surface acoustic wave devices, as follows:

(1) Document 1: a monograph of PIONEER R&D Vol. 7 No. 1, entitled "Growth of Nonlinear Optical Crystal Films for SHG Devices by Vapor Phase Deposition", which discloses a method for forming $KNbO_3$ thin films, used as waveguides of SHG (Second Harmonic Generation) light emission elements, on $SrTiO_3$ substrates by using MOCVD (an abbreviation for "Metal Organic Chemical Vapor Deposition").

(2) Document 2: a monograph of Mat. Res. Soc. Symp. Proc. Vol. 271 for 1992 Materials Research Society, entitled "THE GROWTH OF SINGLE CRYSTAL-LIKE AND POLYCRYSTAL $KNbO_3$ FILMS VIA SOL-GEL PROCESS", which discloses a method for forming $KNbO_3$ thin films on $SrTiO_3$ substrates by sol-gel processing.

As described above, if the $KNbO_3$ single crystals are used as piezoelectric materials, it is possible to actualize surface acoustic wave devices which have large electromechanical coupling factors $K^2$ and high efficiencies in propagation of acoustic waves. In addition, it has been proven that values of $K^2$ are changed in various manners in response to the propagation directions of surface acoustic waves in crystal structures of the $KNbO_3$ single crystals. So, there is a strong demand to obtain a desired value of $K^2$ or control $K^2$ in the manufacture of surface acoustic wave devices. To cope with such a demand, it is necessary to match a propagational plane of the surface acoustic waves with a specific crystal orientation plane of $KNbO_3$. That is, an interdigital transducer is formed to suit the specific crystal orientation plane, so that the propagational plane of the surface acoustic waves are matched with the specific crystal plane.

Suppose that a $KNbO_3$ single crystal having a perovskite crystal structure shown in FIG. 8 is used as bulk material. To obtain a specific crystal orientation, it is necessary to perform very troublesome operations for cutting out a specific crystal plane from a $KNbO_3$ single crystal whose crystal orientation is known. In addition, the $KNbO_3$ single crystal is difficult to grow, and therefore is very expensive as an industrial material. For the reasons described above, it is very hard to use the aforementioned bulk material made of the $KNbO_3$ single crystal as the material for the surface acoustic wave device.

The aforementioned difficulties challenge engineers to develop a concept in which the $KNbO_3$ single crystal is not used as a bulk material but is used as a thin film being formed on some substrate in a laminated manner. However, even if a $KNbO_3$ single crystal thin film is directly formed on general-purpose substrate materials such as MgO, Pt, $Al_2O_3$, GaAs and Si, it is impossible to obtain sufficient lattice matching between crystals, so $KNbO_3$ is hardly subjected to epitaxial growth. In addition, the formed $KNbO_3$ thin film itself is relatively low in crystallinity. As a result, it is impossible to obtain a good property (i.e., large value of $K^2$). Both of the aforementioned documents 1, 2 are related to a method for forming a thin $KNbO_3$ film directly on a $SrTiO_3$ substrate. Even in such a method, it is impossible to obtain sufficient lattice matching between crystals of $KNbO_3$ (lattice constants: a=5.70, b=5.72, c=3,97) and $SrTiO_3$ (lattice constants: a=b=c=3.91).

SUMMARY OF THE INVENTION

It is an object of the invention to provide a surface acoustic wave device, which can be manufactured without troublesome operations for cutting out a specific crystal plane from a single crystal bulk material.

It is another object of the invention to provide a surface acoustic wave device which is increased in electromechanical coupling factor $K^2$ to achieve a high efficiency in propagation of surface acoustic waves.

Thus, the surface acoustic wave device of this invention is used in wide bands and is manufactured with relatively low cost.

A surface acoustic wave device of this invention is basically configured by a substrates a buffer layer, a piezoelectric layer and an electrode layer. Herein, the substrate is made of a bulk material (e.g., $SrTiO_3$) which allows the growth thereon of a perovskite compound crystal expressed by a general chemical formula of $SrZO_3$ (where Z denotes an element such as Zr and Sn whose valence is 4). The buffer layer is formed on the substrate and is made of the perovskite compound crystal (e.g., $SrZrO_3$, $SrSnO_3$) which has: good lattice matching with $KNbO_3$. The piezoelectric layer is made of a $KNbO_3$ single crystal and is formed on the buffer layer with a thickness of 500 nm or so. The electrode layer is formed on or below the piezoelectric layer. An interdigital transducer consisting of input and output electrodes is formed by patterning using a photolithography technique being effected on the electrode layer, which is made of a metal material (e.g., Al). In addition, it is possible to form a temperature stabilization layer over the piezoelectric layer and/or electrode layer. The temperature stabilization layer is made of a material ($SiO_2$) having a temperature coefficient reverse to a temperature coefficient of the piezoelectric layer so as to ease distortion caused by the differences in thermal expansion between the piezoelectric layer and the electrode layer. Incidentally, the temperature stabilization layer has a prescribed thickness, which is approximately 1000 nm.

Moreover, the $KNbO_3$ single crystal forming the piezoelectric layer is made up with all crystal planes containing an X-axis. Further, the buffer layer is made of at least one crystal compound, which is selected from among $SrTiO_3$, $SrZrO_3$, $SrMoO_3$, $SrSnO_3$ and $SrHfO_3$. Furthermore, the bulk material for the substrate is made of at least one crystal compound, which is selected from among $SrTiO_3$, MgO, Pt, $Al_2O_3$, GaAs and Si.

Thus, it is possible to increase the electromechanical coupling factor $K^2$, which contributes to broad-band application of the device to operate with high efficiency.: In addition, the surface acoustic wave device (e.g., filter and convolver) is capable of operating in a high frequency bandwidth and is manufactured with low cost.

BRIEF DESCRIPTION OF THE DRAWINGS

These and other objects, aspects, examples and samples of the present invention will be described in more detail with reference to the following drawing figures, of which:

FIG. 10 shows relationships between the configurations, electromechanical coupling factors and insertion loss among samples comparative samples 1–11 and comparative samples 1–6; and FIG. 11 shows a relationship between the configurations, electromechanical couplings factor, insertion loss and frequency temperature coefficients between a sample 12 and a comparative sample 7.

DESCRIPTION OF THE PREFERRED EMBODIMENT

Figure 1A:
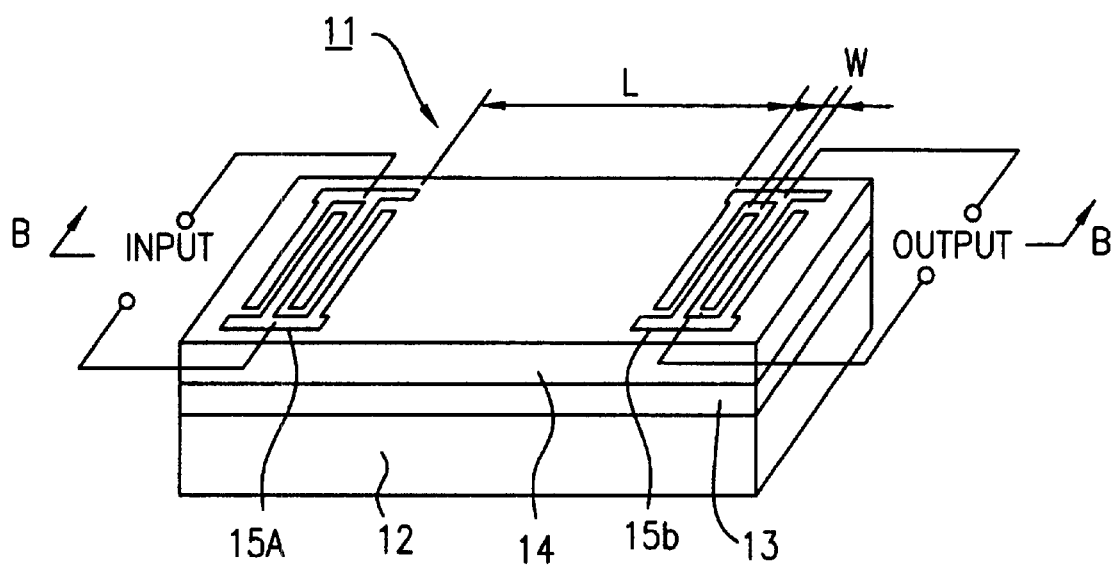
FIG. 1A is a perspective view showing a surface acoustic wave filter in accordance with an example 1 of this invention.

This invention will be described in detail by way of examples and samples with reference to the accompanying drawings.

[A] Fundamental Concept

Before concretely describing examples and samples of this invention, a description will be given with respect to the fundamental concept of the formation and properties, of the surface acoustic wave device in accordance with this invention.

The surface acoustic wave device of this invention is basically formed by a substrate, a buffer layer and a piezoelectric layer, which are formed together in a laminated manner, as well as an electrode layer. Herein, the substrate is made of a bulk material on which a perovskite compound crystal being expressed by a general chemical formula of $SRZO_3$ (where Z: an element whose valence is 4) is subjected to growth The buffer layer is made of the perovskite compound crystal and is formed on the substrate. The piezoelectric layer is made of a $KNbO_3$ single crystal and is formed on the buffer layer. The electrode layer is arranged on an upper surface or lower surface of the piezoelectric layer.

As the material for the buffer layer, it is possible to use at least one crystal compound selected from among $SrTiO_3$, $SrZrO_3$, $SrMoO_3$, $SrSnO_3$ and $SrHfO_3$, for example. Incidentally, it is preferable to select a thickness of the buffer layer to belong to a range of thickness between 10 nm and 100 nm, for example.

As the material for the substrate on which the buffer layer made of the above material is subjected to growth, it is possible to use at least one crystal compound selected from among $SrTiO_3$, MgO, Pt, $Al_2O_3$, GaAs and Si, for example.

As described above, the surface acoustic wave device of this invention is not constructed such that a $KNbO_3$ piezoelectric layer is directly formed on the substrate. According to this invention, a buffer layer made of the perovskite compound crystal expressed by the general chemical formula of $SrZO_3$ is formed on the substrate. Then a $KNbO_3$ piezoelectric layer is formed on the buffer layer.

As examples for the perovskite compound crystal expressed by SRZO3, it is suitable to list SrZrO, and $SrSnO_3$. As an example of the substrate, it is suitable to list $SrTiO_3$. Using those examples of materials, it is possible to form a surface acoustic wave device, as follows:

On an $SrTiO_3$ (110) single crystal substrate (lattice constants: a=b=c=3.91), a buffer layer made of $SrZrO_3$ (200) lattice constants: a=5.82, b=8.20, c=5.80) or $SrSnO_3$ (220) (lattice constants: a=b=c=8.07) is subjected to crystal growth. On the buffer layer, $KNbO_3$ (010) is further subjected to epitaxial growth.

With respect to an epitaxial crystal plane, the aforementioned materials have lattice dimensions as follows:

$SrTiO_3$ (110): 3.91 Å×5.53 Å
$SrZrO_3$ (200): 4.10 Å×5.80 Å
$SrSnO_3$ (220): 4.04 Å×5.71 Å
$KNbO_3$ (010): 3.97 Å×5.70 Å

As compared with the surface acoustic wave device which is made by forming a $KNbO_3$ (010) single crystal directly on an $SrTiO_3$ (110) single crystal substrate by epitaxial growth, the surface acoustic wave device of this invention is made such that a $KNbO_3$(010) single crystal is subjected to epitaxial growth on an $SrTiO_3$ (110) single crystal substrate by way of a buffer layer made of $SrZrO_3$ (200) or $SrSnO_3$ (220), which has a relatively small misfit rate with the $KNbO_3$ (010) Single crystal. Thus, it is possible to actualize growth of crystals with high crystal orientation.

As described above, it is possible to obtain a $KNbO_3$ piezoelectric layer with good crystallinity, and it is possible to control a crystal plane on which the piezoelectric layer is being formed. In addition, such a crystal plane can be used as a propagation plane which allows the propagation of surface acoustic waves. Thus, it is possible to realize a surface acoustic wave device which has a relatively large electromechanical coupling factor $K^2$ and which is applied in broad bands with high efficiency in transduction. Incidentally, it is preferable to select a thickness of the piezoelectric layer made of the $KNbO_3$ single crystal within a range of thickness between 50 nm and 5000 nm.

In addition, it is preferable that the $KNbO_3$ single crystal forming the piezoelectric layer is made to contain all crystal planes including an X-axis.

Figure 8:
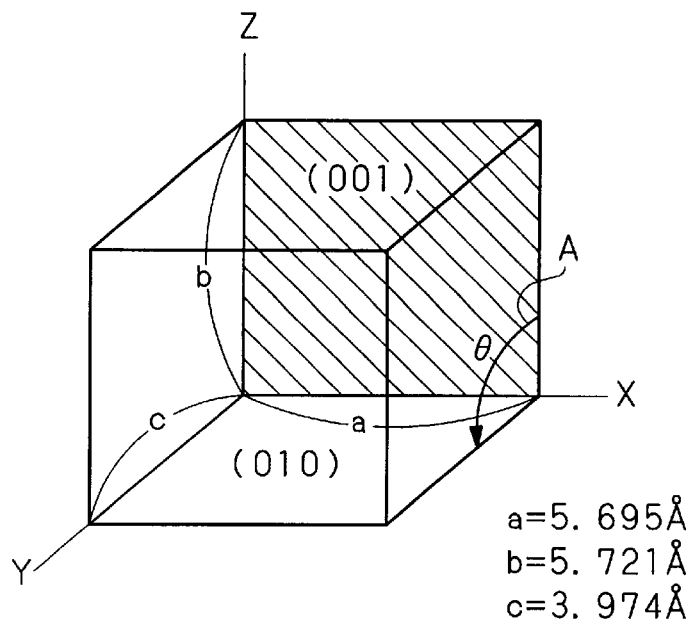
FIG. 8 is a perspective view showing an example of a $KNbO_3$, single crystal having a perovskite crystal structure.

In the present specification, the "X-axis" is defined as a ridgeline direction of a unit lattice "a" (5.695 A). In addition, the $KNbO_3$ single crystal is orthorhombic, so as shown in FIG. 8, a Y-axis is defined as a ridgeline in the direction indicated by the label "c" (3.974 Å), and a Z-axis is defined as a ridgeline in the direction indicated by the label "b" (5.721 Å).

Figure 9:
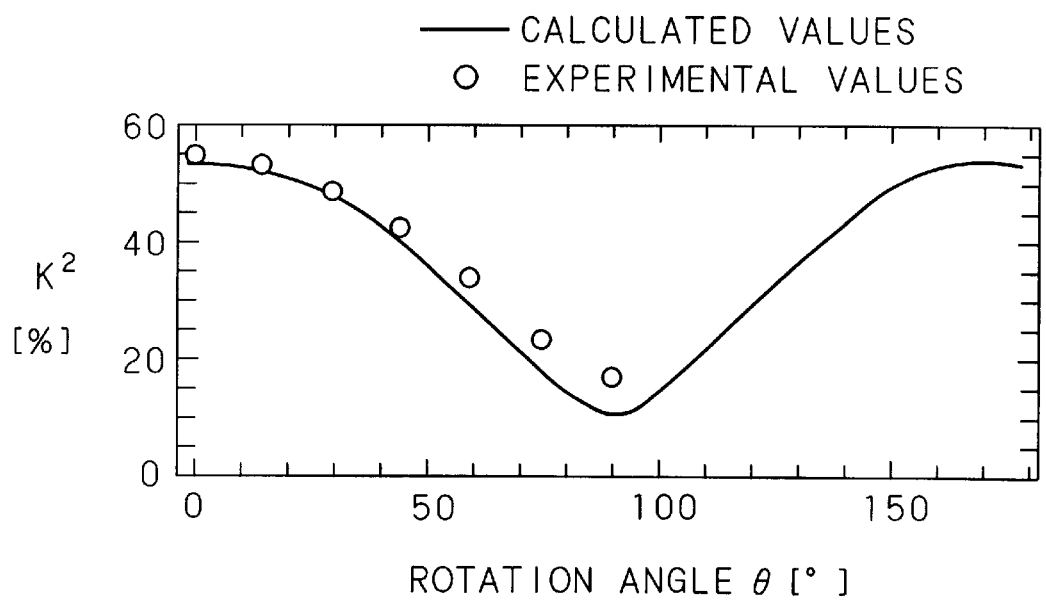
FIG. 9 is a graph showing a relationship between electromechanical coupling factors and rotation angles of a rotated Y-plate of a $KNbO_3$ single crystal.

Reasons why the $KNbO_3$ single crystal is made to contain all crystal planes including an X-axis are as follows:

FIG. 9 shows a relationship between an electromechanical coupling factor $K^2$ and a rotation angle θ of a rotated Y-plate of a $KNbO_3$ single crystal bulk material. Herein, the "Y-plate" corresponds to a plane which contains a ridgeline of a unit lattice "a" (5.695 Å) and a ridgeline of a unit lattice "b" (5.721 Å). In addition, the rotation angle θ is an angle of rotation of the rotated Y-plate (i.e., plane (001) shown in FIG. 8), which rotates about an X-axis in a direction A. Incidentally the plane (001)itself has a rotation angle θ=0°. FIG. 9 shows that the electromechanical coupling factor $K^2$ reaches a maximum value of 0.53 (or 53%) when rotation angle θ=0°. In the case of θ=90° of the plane (001) which is equivalent to a plane (010) it is possible to obtain a certain electromechanical coupling factor of $K^2$=0.2 (or 20%) or so, which is sufficiently greater than the $K^2$=0.055 achieved with $LiNbO_3$. For this reason, the inclusion of all crystal planes that provide values of $K^2$ within a range of 0.2–0.53 will be referred to herein with the phrase "all crystal planes including an X-axis" to represent planes each of the which is formed by rotating the plane (001) about the X-axis by an arbitrary angle.

FIG. 9 merely shows measured values of $K^2$ with respect to a surface acoustic wave device, which is manufactured using the $KNbO_3$ single crystal bulk material. Herein, the surface acoustic wave device using a $KNbO_3$ thin film does not necessarily provide values of $K_2$ with ranges between 0.2 and 0.53. In fact, the surface acoustic wave device using a $KNbO_3$ thin film has smaller values of $K^2$. However as compared with a $LiNbO_3$ thin film, a thin film made of the $KNbO_3$ single crystal has a sufficiently greater value of $K^2$.

In addition to the aforementioned layers, it is possible to further form a temperature stabilization layer made of $SiO_2$ on the piezoelectric layer in a laminated manner. In that case, the surface acoustic wave device as a whole is constructed such that a surface of the piezoelectric layer is covered with the temperature stabilization layer of $SiO_2$, which has a temperature coefficient reverse to that of the piezoelectric layer. Hence, such an $SiO_2$ layer eases distortion caused to occur on the piezoelectric layer due to differences in thermal expansion between the piezoelectric layer and electrode layer. Thus, it is possible to stabilize a temperature characteristic of the surface acoustic wave device. Incidentally, it is preferable to select a thickness of the temperature stabilization layer of $SiO_2$ within a range of thickness between 100 nm and 10000 nm.

[B] EXAMPLES

Next, examples of surface acoustic wave devices will be described in detail with reference to the accompanying drawings in accordance with this invention.

(1) Example 1

Figure 1B:
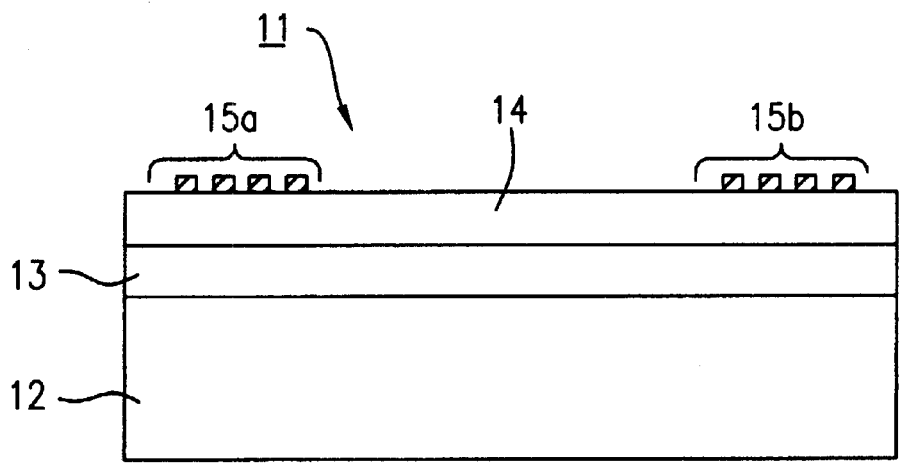
FIG. 1B is a cross sectional view taken along line B—B in FIG. 1A.

FIGS. 1A and 1B show a surface acoustic wave device 11 in accordance with an example 1 of this invention. Actually, the surface acoustic wave device 11 functions as a surface acoustic wave filter that filters out signal components of specific frequencies from input signals.

As shown in FIGS. 1A, 1B, a buffer layer 13 made of perovskite compound crystal material such as $SrSnO_3$ and $SrZrO_3$, and a piezoelectric layer 14 made of a $KNbO_3$ single crystal are sequentially formed on a substrate 12 made of a single crystal bulk material such as $SrTiO_3$ in a laminated manner. On an upper surface of the piezoelectric layer 14, electrodes 15a, 15b of an interdigital transducer made of metal material such as Al is formed at selected positions. For example, the thickness of the buffer layer 13 is approximately 100 nm, while the thickness of the piezoelectric layer 14 is approximately 500 nm. Other than $SrTiO_3$, the substrate 12 can be made using at least one crystal compound, which is selected from among MgO, Pt, $Al_2O_3$, GaAs and Si, for example. Other than Al, the electrodes 15a, 15b can be made using metal material or alloy, which is selected from among Ti, Au, Ag, W and Cu, for example.

As shown in FIG. 1A, the interdigital transducer contains an input electrode 15a for inputting signals being processed and an output electrode 15b for outputting signals of specific frequencies being selected. Those electrodes 15a, 15b are arranged on both sides of the substrate 14 to oppose each other. Each of the electrodes 15a, 15b has multiple pairs of comb-shaped electrode patterns each having electrode teeth. If λ designates a wavelength of surface acoustic waves a width w of each electrode is λ/4, and a number of pairs is 30. In addition, a distance L between the input electrode 15a and the output electrode 15b is 50 λ.

In short, the aforementioned surface acoustic wave filter 11 is manufactured as follows:

On the substrate 12, the buffer layer 13 is formed by the perovskite compound crystal, made of $SrSnO_3$ or $SrZrO_3$, on which the piezoelectric layer 14 is formed by the $KNbO_3$ single crystal. Those layers are sequentially formed in accordance with a sol gel processing method, laser abrasion method, sputtering method, CVD method, etc. In addition, an Al film is formed by vapor deposition, sputtering method, etc. Then, the photolithography technique is used to perform patterning of the Al film, so that the interdigital transducer 15a, 15b is formed on the piezoelectric layer 14.

In the surface acoustic wave filter 11, when signals are input to the input electrode 15a, distortions which are reverse from each other in phase are caused to occur in gaps between adjoining electrodes due to piezoelectric effects possessed by the piezoelectric layer 14. This excites surface acoustic waves to occur on the surface of the substrate (i.e., main body of the surface acoustic wave filter 11). The surface acoustic waves being excited propagate on the surface of the substrate, then, the output electrode 15b transduces them to high-frequency signals, which are then extracted.

As described above, the surface acoustic wave filter 11 of this example is not designed in such a manner that the $KNbO_3$ single crystal is directly formed (or deposited) on the $SrTiO_3$ substrate 12. In fact, this example is characterized by the presence of buffer layer 13, which is made of $SrSnO_3$ or $SrZrO_3$ and which has the property of reducing a misfit rate at the interface with the $KNbO_3$ single crystal. Thus, it is possible to form the piezoelectric layer 14 from a $KNbO_3$ single crystal, which has a specific crystal plane (e.g., plane (001) or (010)), with ease. As a result, the surface acoustic wave filter 11 has a relatively large electromechanical factor $K^2$. Thus, it is possible to manufacture surface acoustic wave filters which are capable of operating in broad bands with high efficiencies.

In addition, this example eliminates any necessity to perform difficult operations, as was required conventionally, related to the crystal growth of the $KNbO_3$ bulk single crystal and cutting off a specific crystal plane from the $KNbO_3$ single crystal. For this reason, it is possible to form the $KNbO_3$ piezoelectric layer 14 with ease by using thin film formation techniques such as sol-gel processing, laser abrasion, sputtering and CVD. In addition, it is possible to reduce the amount of $KNbO_3$ material being used. As a result, this example is capable of reducing the cost of manufacturing surface acoustic wave filters to be lower than the cost conventionally encountered.

(2) Example 2

Figure 2:
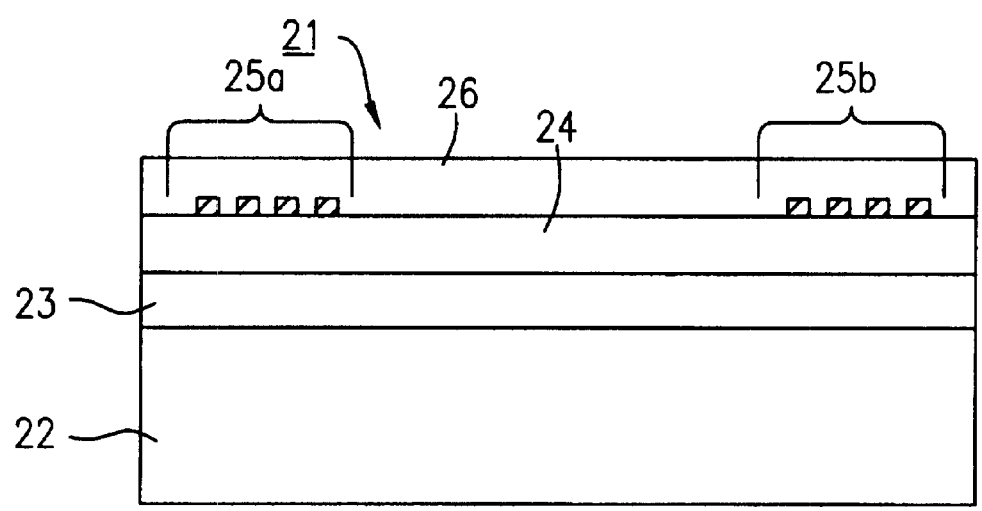
FIG. 2 is a cross sectional view showing a configuration of a surface acoustic wave filter in accordance with an example 2 of this invention.

Next, a description will be provided with respect to a surface acoustic wave filter 21 of an example 2 with reference to FIG. 2.

FIG. 2 is a cross sectional view showing the structure of the surface acoustic wave filter 21 of the example 2. The surface acoustic wave filter 21 of example 2 differs from the aforementioned example 1 in that the filter of example 2 includes a temperature stabilization layer on the piezoelectric layer.

Concretely speaking, the surface acoustic wave filter 21 of example 2 is manufactured as follows:

On a substrate 22 made of single crystal bulk material such as $SrTiO_3$, a buffer layer 23 and a piezoelectric layer 24 are sequentially formed. Herein, the buffer layer 23 is made of a crystalline material such as $SrZrO_3$, while the piezoelectric layer 24 is made of a $KNbO_3$ single crystal. On the piezoelectric layer 24, electrodes 25a, 25b (or electrode layer) of an interdigital transducer are formed by Al or other metal material. Then, a temperature stabilization layer 26 made of $SiO_2$ is formed on the entire surface of the piezoelectric layer 24. Thus, the electrodes 25a, 25b are completely covered with the temperature stabilization layer 26. Herein, the thickness of the temperature stabilization layer 26 is 1000 nm or so, while the thickness of the piezoelectric layer 24 is 500 nm or so.

In the surface acoustic wave filter 21 of example 2, the surface of the piezoelectric layer 24 is covered with the temperature stabilization layer 26 made of $SiO_2$, which has a temperature coefficient reverse to that of $KNbO_3$. Therefore, the temperature stabilization layer 26 functions to ease distortions caused to occur on the piezoelectric layer 24 due to differences in thermal expansion between the piezoelectric layer 24 and the electrodes 25a, 25b. Thus, it is possible to stabilize temperature characteristics of the surface acoustic wave filter.

Incidentally, the scope of the invention is not necessarily limited to the aforementioned examples, hence, it is possible to embrace a variety of modifications without departing from the essential aspects of the invention. That is, the aforementioned examples merely show examples of concrete numeric values for thickness of layers and dimensions of transducers (or electrodes), which can be changed according to needs in design. In addition, the electrodes are not necessarily formed on the piezoelectric layer, as they can be formed instead beneath the piezoelectric layer (or at the interface with the buffer layer). The aforementioned examples describe the surface acoustic wave filters. Of course, this invention is not necessarily limited to such surface acoustic wave filters. That is, this invention is applicable to a wide variety of fields such as elements or components used for communications. For example, the transducers can be changed in configuration to actualize surface acoustic wave convolvers other than filters.

[C] SAMPLES

Next, descriptions will be presented for a plurality of samples which have been actually made to provide empirical proof of effects of this invention.

Of course, the samples of surface acoustic wave devices actually made and described herein show merely examples of this invention, so this invention is not necessarily limited to those samples. Hence, it is possible to adequately change the configurations of the samples within the scope of the invention.

(1) First Examination

For a first examination, various samples were made in accordance with the configuration of the surface acoustic wave filter of the foregoing example 1 (see FIGS. 1A, 1B). Herein, the first examination was performed with respect to effects on the characteristics of surface acoustic wave devices using buffer layers, which were made of the designated material specifically employed by this invention, in comparison with various cases in which the buffer layer was omitted, or in which the buffer layer was made of other materials.

Eleven samples numbered 1 to 11 were made for the first examination, which were manufactured as follows:

(a) Sample 1: $KNbO_3(010)/SrSnO_3/SrTiO_3(110)$ (i) Making of $SiSnO_3$, sol-gel solution A sol-gel solution was made using starting materials such as diethoxystrontium and tetraethoxytin.

(ii) $SrSnO_3$, sol-gel solution coating

Using a spin-coater, a $SrTiO_3$ (110) single crystal substrate was coated with the $SrSnO_3$ sol-gel solution, wherein (110) designates a specific crystal plane.

(iii) $SrSnO_3$ dry

After coating, the substrate was dried at 150° C.

(iv) $SrSnO_3$ calcination

After drying, the substrate was subjected to calcination (or heat treatment) at 800° C. In this case, the $SrSnO_3$, layer has a film thickness of 100 nm.

(v) Making of $KiNbO_3$ sol-gel solution

A $KNbO_3$ solution was made using starting materials such as ethoxypotassium and pentaethoxy-niobium.

(vi) $KnbO_3$ sol-gel solution coating

Using a spin-coater, the substrate was coated with the $KNbO_3$, sol-gel solution.

(vii) $KnbO_3$, dry

After coating, the substrate was dried at 150° C.

(viii) $KNbO_3$ calcination

After drying, the substrate was subjected to calcination at 800° C. In this case, the $KnbO_3$, layer has a film thickness of 500 nm.

(ix) XRD measurement

Figure 3:
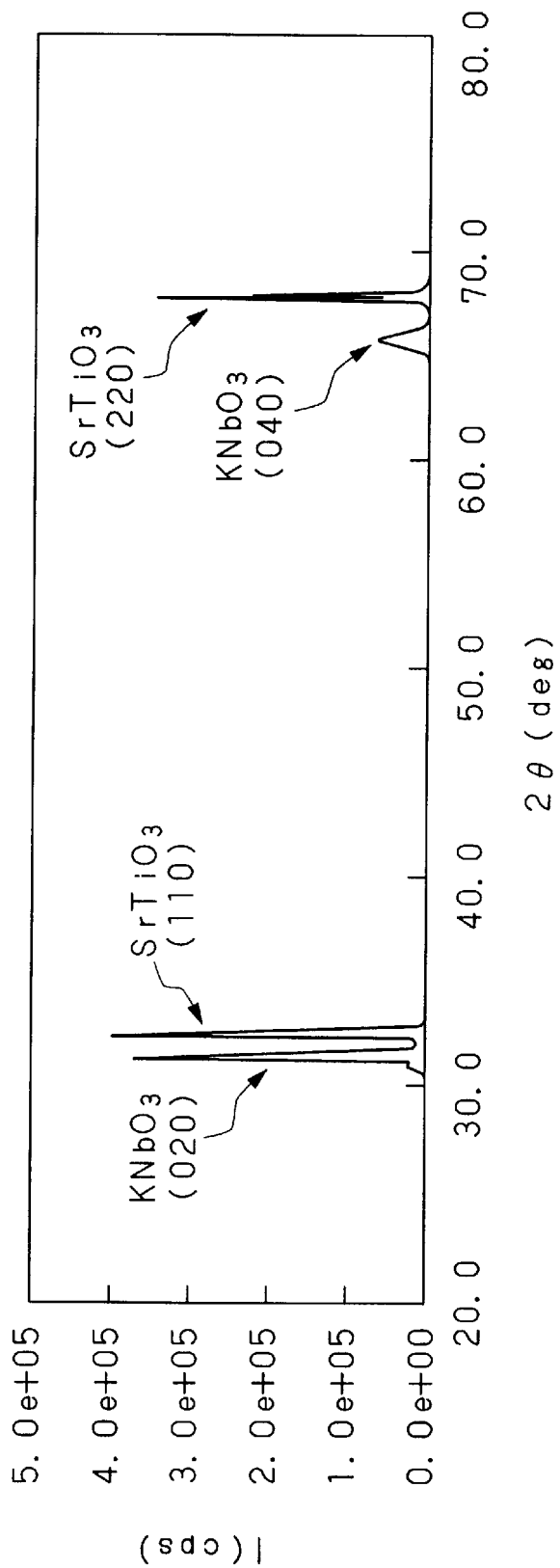
FIG. 3 shows XRD spectrum patterns being measured with respect to a sample 1.

An X-ray diffraction measurement was conducted on the substrate manufactured as described above. In the measurement, it was confirmed that a $KNbO_3$ (010) crystal was actually formed, having lattice constants: a=5.70, b=5.72, c=3.97. FIG. 3 shows XRD spectrum patterns of the sample 1, wherein a horizontal axis represents a "diffraction angle" of 2 (deg).

Thus, sample 1 was made by procedures of the treatments or processes (i) to (ix).

(b) Sample 2: $KNbO_3$ (001)/$SrSnO_3$/$SrTiO_3$ (100)

Figure 5:
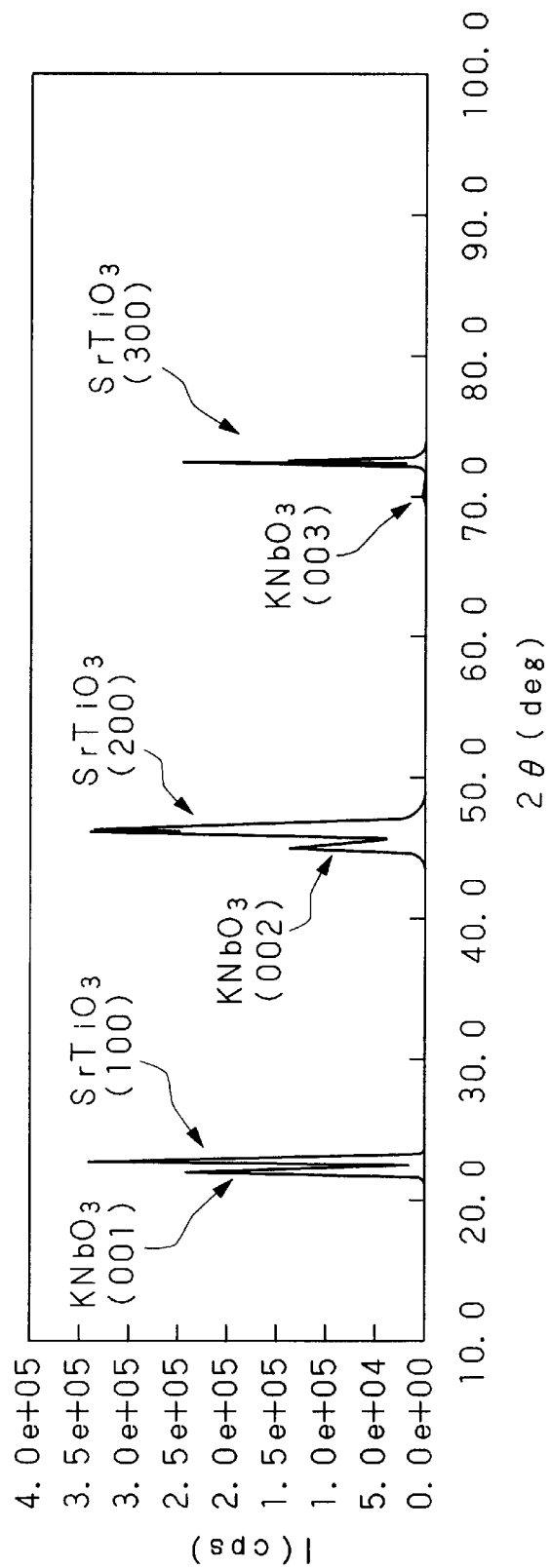
FIG. 5 shows XRD spectrum patterns being measured with respect to a sample 2.

Sample 2 is similar to the aforementioned sample 1 except that a $SrTiO_3$ (100) Single crystal substrate was used. By an XRD measurement, it was confirmed that a $KNbO_3$ (001) crystal is actually formed, having lattice constants: a=5.70, b=5.72, c=3.97. FIG. 5 shows XRD spectrum patterns of the sample 2.

Thus, sample 2 was manufactured by the aforementioned procedures. (c) Sample 3: $KNbO_3$ (010)/$SrZrO_3$,/$SrTiO_3$. (110)

Sample 3 is basically similar to the aforementioned sample 1 except that $SrZrO_3$ was made using a sol-gel solution which was made using starting materials such as diethoxy-strontium and tetraisopropoxyzirconium. By an XRD measurement, it was confirmed that a $KnbO_3$ (010) crystal is actually formed.

Thus, sample 3 was made by the aforementioned procedures.

(d) Sample 4: $KnbO_3$ (010)/$SrMoO_3$/$SrTiO_3$ (110)

Sample 4 was made in a basically similar manner as sample 1 except for the following conditions:

(i) $SrMoO_3$, was made using sol-gel solution which was made using starting materials such as diethoxy-strontium and molybdenumdiacetyl-acetonate.

(ii) A $KNbO_3$ film was formed using potassium-dipibaloyl-methane, pentaethoxy-niobium and oxygen in accordance with the MOCVD method.

Incidentally, the temperature of the substrate was increased to 800° C. in the MOCVD process. In addition, the film thickness was 500 nm. By an XRD measurement, it was confirmed that a $KNbO_3$ (010) crystal was actually formed.

Thus, sample 4 was made by the aforementioned procedures.

(e) Sample 5: $KNbO_3$ (010)/$SrHfO_3$/$SrTiO_3$,(110)

Sample 5 was made in a basically similar manner as sample 1 except for the following conditions:

(i) $SrHfO_3$, was made using sol-gel solution which was made using starting materials such as diethoxy-strontium and tetraisopropoxy-hafnium.

(ii) A $KNbO_3$ film was formed using a $KNbO_3$ target in accordance with the sputtering method.

Incidentally, the temperature of the substrate was increased to 800° C. in the sputtering process. In addition, the film thickness is 500 nm. By an XRD measurement, it was confirmed that a $KNBbO_3$ (010) crystal was actually formed.

Thus, sample 5 was made by the aforementioned procedures.

(f) Sample 6: $KnbO_3$ (010)/$SrTiO_3$/$SrTiO_3$ (110)

Sample 6 is similar to sample 1 except that $SrTiO_3$ was made sing sol-gel solution which was made using starting materials such as diethoxy-strontium and tetraisopropoxy-titanium. By an XRD measurement, it was confirmed that a $KnbO_3$. (010) crystal was actually formed.

Thus, the sample 6 was made by the aforementioned procedures.

(g) Sample 7: $KNbO_3$ (001)/$SrSnO_3$/MgO (100)

Sample 7 is similar to sample 2 except that a MgO (100) single crystal substrate was used. By an XRD measurement, it was confirmed that a KNbO3 (001) crystal was actually formed.

Thus, sample 7 was made by the aforementioned procedures.

(h) Sample 8: $KnbO_3$, (001)/$SrSnO_3$/Pt (100)

Sample 8 is similar to sample 2 except that a Pt (100) single crystal substrate was used. By an XRD measurement, it was confirmed that a KNbO3 (001) crystal was actually formed.

Thus, sample 8 was made by the aforementioned procedures.

(i) Sample 9: $KNbO_3$ (010)/$SrSnO_3Al_2O_3$ (1-102)

Sample 9 was made in a basically similar manner as sample 1 except for the following conditions:

(i) $AAl_2O_3$ (1-102) single crystal substrate was used.

(ii) $AKNbO_3$ film was formed using a $KNbO_3$ target in accordance with the sputtering method.

Incidentally, the temperature of the substrate was increased to 800° C., in the sputtering process. In addition, the film thickness is 500 nm. By an XRD measurement, it was confirmed that a $KNBO_3$, (010) crystal was actually formed.

Thus, the sample 9 was made by the aforementioned procedures.

(j) Sample 10: $KNbO_3$, (001)/$SrSnO_3$/GaAs (100)

Sample 10 was made in a basically similar manner as sample 2 except for the following conditions:

(i) A GaAs (100) single crystal substrate was used.

(ii) A $KNbO_3$ film was formed using potassium-dipivaroil-methane, pentaethoxy-niobium and oxygen in accordance with the MOCVD method.

Incidentally, the temperature of the substrate was increased to 800° C. in the MOCVD process. In addition, the film thickness was 500 nm. By an XRD measurement, it was confirmed that a $KNbO_3$ (001) crystal was actually formed.

Thus, sample 10 was made by the aforementioned procedures.

(k) Sample 11: $KNbO_3$ (010)/$SrSnO_3$/Si (110)

Sample 11 was made in a basically similar manner as sample 2 except for the following conditions:

(i) A Si (110) single crystal substrate was used.

(ii) A $KNbO_3$ film was formed using potassium-dipivaroil-methane, pentaethoxy-niobium and oxygen in accordance with the MOCVD method.

Incidentally, the temperature of the substrate was increased to 800° C. in the MOCVD process. In addition, the film thickness was 500 nm. By an XRD measurement, it was confirmed that a $KNbO_3$ (010) crystal was actually formed.

Thus, sample 11 was made by the aforementioned procedures.

(1) Comparative Sample 1: $KNbO_3$ (010)/$SrTiO_3$, (110)

(i) Making of $KNbO_3$ sol-gel solution

A sol-gel solution was made using starting materials such as ethoxypotassium and pentaethoxy-niobium.

(ii) Coating of $KNbO_3$, sol-gel solution

Using a spin-coater, a $SrTiO_3$ (110) single crystal substrate was coated with $KNbO_3$; sol-gel solution.

(iii) $KNBO_3$, dry

After coating, the substrate was dried at 150° C.

(iv) $KNbO_3$ calcination

After drying, the substrate was subjected to calcination at 800° C. In this case, the $KnO_3$, layer has a film thickness of 500 nm.

(v) XRD measurement

Figure 4:
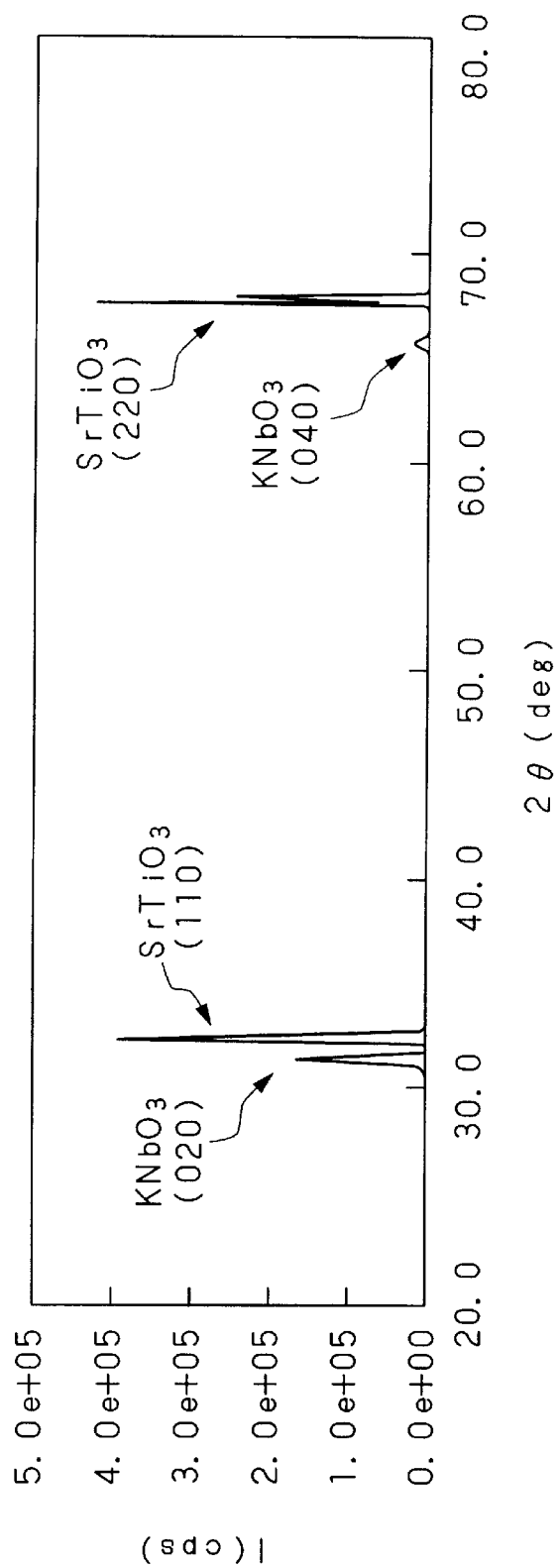
FIG. 4 shows XRD spectrum patterns being measured with respect to a comparative sample 1.

By conducting an XRD measurement, it was confirmed that a $KNbO_3$ (010) crystal was actually formed, having lattice constants: a=5.70, b=5.72, c=3.97. FIG. 4 shows XRD spectrum patterns of comparative example 1.

Thus, comparative sample 1 was made by the aforementioned procedures (i) to (v).

(m) Comparative sample 2: $KNbO_3$ (001)/$SrTiO_3$ (100)

Figure 6:
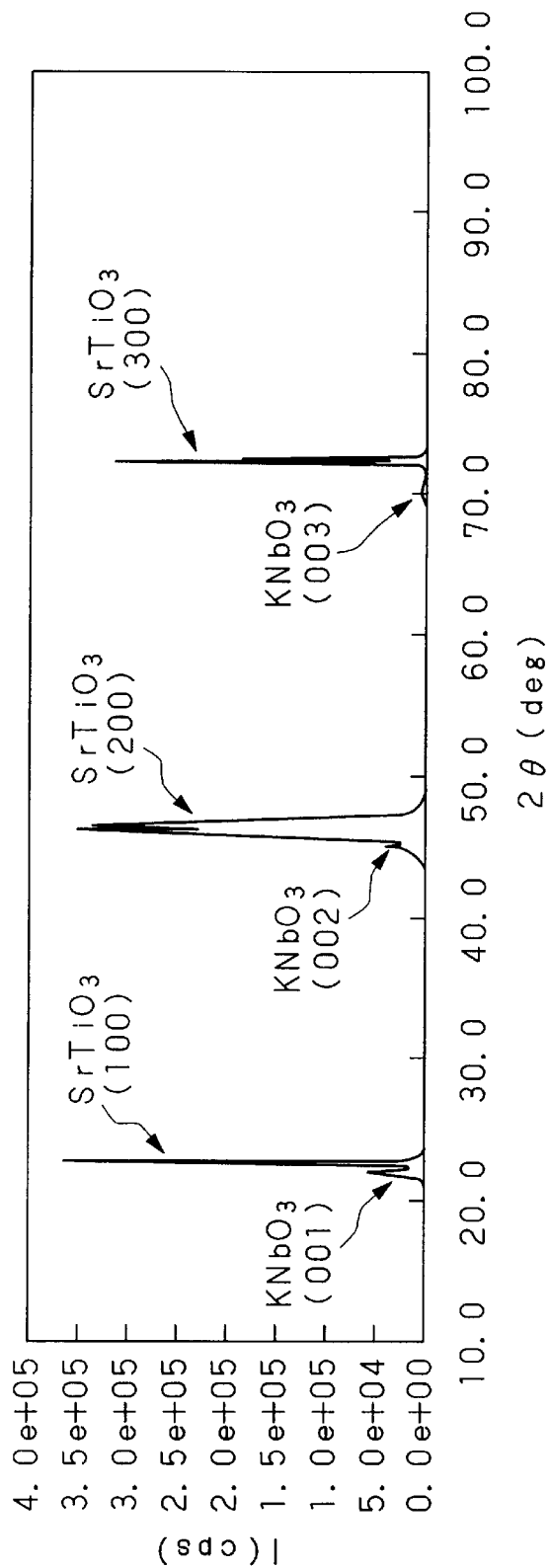
FIG. 6 shows XRD spectrum patterns being measured with respect to a comparative sample 2.

Comparative sample 2 is similar to comparative sample 1 except that a $SrTiO_3$, (100) single crystal substrate was used. By an XRD measurement, it was confirmed that a $KNbO_3$ (001) crystal was actually formed, having lattice constants: a=5.70, b=5.72, c=3.97. FIG. 6 shows XRD spectrum patterns of comparative sample 2.

Thus, the comparative sample 2 was made by the aforementioned procedures.

(n) Comparative sample 3: $KNbO_3$ (010)/$CaZrO_3$/$SrTiO_3$ (110)

Comparative sample 3 is similar to comparative sample 1 except that a $CaZrO_3$ layer was formed on a $SrTiO_3$. (110) substrate by using a sol-gel solution which was made using starting materials such as disopropoxy-calcium and tetralsopropoxy-zirconium. By an XRD measurement, it was confirmed that a $KNbO_3$ (010) crystal was actually formed.

Thus, comparative sample 3 was made by the aforementioned procedures.

(o) Comparative sample 4: $KNbO_3$ (010)/$BaTiO_3$/$SrTiO_3$ (110)

Comparative sample 4 is similar to comparative sample 1 except that a $BaTiO_3$, layer was formed on a $SrTiO_3$, (110) substrate by using sol-gel solution which was made using starting materials such as diethoxybarium and tetralsopropoxy-titanium. By an XRD measurement, it was confirmed that a $KNbO_3$ (010) crystal was actually formed.

Thus, comparative sample 4 was made by the aforementioned procedures.

(p) Comparative sample 5: $KNbO_3$ (010)/$PbTiO_3$, /$SrTiO_3$ (110)

Comparative sample 5 is similar to comparative sample 1 except that a $PbTiO_3$ layer was formed on a $SrTiO_3$ (110) substrate by using sol-gel solution which was made using starting Materials such as lead acetate and tetraisopropoxy-titanium. By an XRD measurement, it was confirmed that a $KNbO_3$ (010) crystal was actually formed.

Thus, comparative sample 5 was made by the aforementioned procedures.

(q) Comparative sample 6: $KNbO_3$ (010)/$SrSnO_3$/quartz glass

Comparative sample 6 is similar to foregoing sample 1 except that a quartz glass substrate was used. By an XRD measurement, it was confirmed that a $KbO3$ single crystal was not actually formed.

Thus, comparative sample 6 was made by the aforementioned procedures.

As described heretofore, samples 1 to 11 were respectively made in accordance with this invention, while comparative samples 1 to 6 were respectively made for comparison. On each sample, an input electrode and an output electrode of the aforementioned interdigital transducer were formed on an upper surface of the $KNbO_3$, crystal, by which the values of the electromechanical coupling factor $K^2$ were measured.

For measurement of the electromechanical coupling factor $K^2$, an Al-coated sample was prepared in which a propagation path between the input electrode and output electrode was coated with aluminum (or Al). Such an Al-coated sample was prepared in response to each of the samples, which were not coated with aluminum. That is, continuous waves were input to the input electrode of each sample and the input electrode of the corresponding Al-coated sample respectively, so that a phase difference appears between output signals being output from the output electrode of each sample and the output electrode of the corresponding Al-coated sample respectively. Such a phase difference ($\Delta\phi$) was measured to produce a value of the electromechanical coupling factor $K_2$ in accordance with an equation (2), as follows:

$$K^2 = \frac{2(v_{open} - v_{short})}{v_{short}} = \frac{2v_{short}\Delta\phi}{d} \qquad (2)$$

where $v_{open}$ is the propagation velocity of the sample which is not coated with aluminum, $V_{short}$ is the propagation velocity of the Al-coated sample, is an angular velocity of an input signal, and d is a length of the portion coated with aluminum in the Al-coated sample.

The measurement was performed under a prescribed temperature condition, which is at 25° C.

Concretely speaking, the measurement was performed at a temperature of 25° C. for two samples, as follows:

Each of the two samples had a different length L between the input and output electrodes. That is, one sample had a distance L=50λ, while another sample had a distance L=100λ. Herein, high-frequency pulses were input to input electrodes of the two samples respectively. The pulses reach the output electrodes of the two samples at different times, a difference of which was measured as t. Then, the propagation velocity v was calculated based on such a time difference t and a length difference L(=50λ) between the lengths of the two samples in accordance with an equation (3) as follows:

$$v = \frac{L}{t} \tag{3}$$

Then, filters were designed to have a prescribed bandwidth of 20 MHz by using the samples respectively. So, measurement was performed with regard to insertion loss IL, which is one characteristic of the filters.

Incidentally, the measurement for the insertion loss IL was performed using 50 vector network analyzer (HP8752C) without using a matching circuit.

The insertion loss IL is defined by an equation (4) as follows:

$$IL = -20 \log_{10}|S_{21}|\{dB\} \tag{4}$$

where $S_{ij}$ denotes an S parameter (or scattering parameter).

Calibration was performed using the SOLT method (where "SOLT" is an abbreviation for "Shot-Open-Load-Through").

Figure 7:
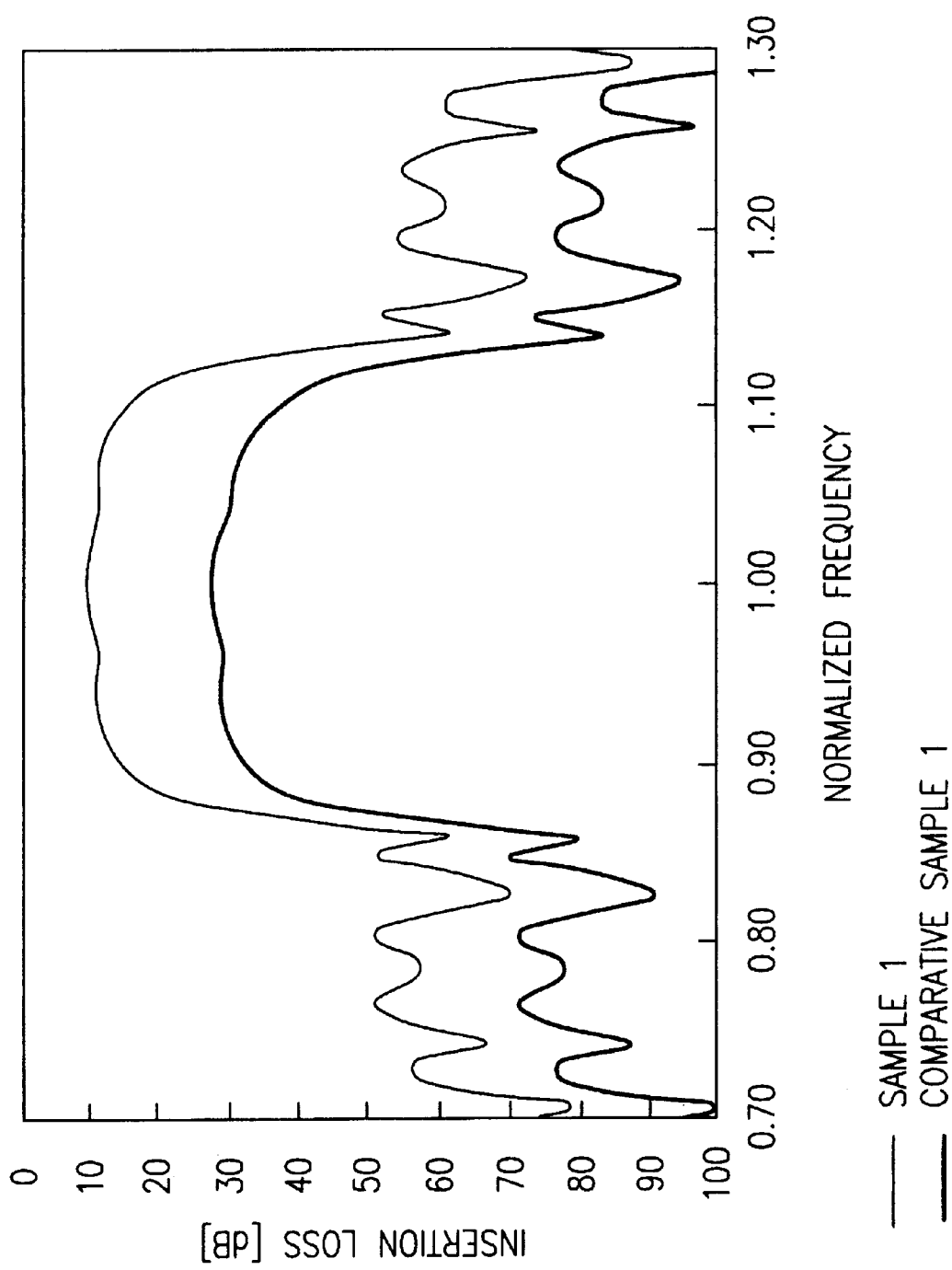
FIG. 7 is a graph showing comparison in insertion loss between the sample 1 and comparative sample 1 with respect to frequencies.

Measurement was performed on, insertion loss characteristics of sample 1 and comparative sample 1 with respect to frequencies. The results are shown in FIG. 7. In addition, FIG. 10 shows the characteristics evaluation results with respect to samples 1–11 and comparative samples 1–6 which have prescribed specifications (or configurations) and dimensions.

FIG. 10 shows that within comparative samples, the comparative sample 2 provides a relatively large value for the electromechanical coupling factor $K^2$. Namely, comparative sample 2 produces 10% for the electromechanical coupling factor $K^2$ because it uses a crystal plane (001). Other comparative samples 1, 3–5 produce only small values (e.g., 1% to 4%) for the electromechanical coupling factor $K^2$. As a result, filters corresponding to those comparative samples have large insertion losses (IL), which range between 28 dB and 30 dB. Thus, those filters have relatively low efficiencies. Further, since comparative sample 6 is designed such that materials of $SrSnO_3$, and $KnbO_3$, are formed on quartz glass substrate which does not have lattice matching with the perovskite compound crystal, it is impossible to obtain a specific crystal plane. Hence, it is impossible to measure the electromechanical coupling factor $K^2$ with respect to comparative sample 6.

In contrast with the comparative samples, samples 1 –11 each of which uses a buffer layer made of a material specifically designated by this invention small values (e.g., 5% to 15%) for the electromechanical coupling factor $K^2$ which are generally larger than those produced in the comparative samples 1 and 3–5. Therefore, it is proved that the samples of this invention are capable of producing sufficient values of efficiencies which are greater than the comparative samples. As a result, it is possible to suppress values of the insertion losses IL to be relatively small, i.e., within a range between 8 dB and 20 dB or so. Therefore, it is proved that filters corresponding to the samples of this Invention are capable of reducing the insertion losses IL to be smaller than the filters corresponding to the comparative samples.

Further, it is possible to obtain good results in the measurements of $K^2$ and IL with respect to sample 6, which is configured by $KNbO_3$ (010) $SrTiO_3/SrTiO_3$ (110). It is believed that such good results were achieved by improvements in conformity with the $KNbO_3$ because of a reduction of the misfit rate and thermal expansion due to the presence of the buffer layer.

As described before, comparative sample 2 can produce good results within comparative samples 1–6. As shown in FIG. 10, sample 2 of this invention has the same crystal plane as the comparative sample 2. However, sample 2 has a larger value of the electromechanical coupling factor $K^2$ than comparative sample 2. That is, even if two samples have the same crystal plane, one of them can be improved in characteristics by using a buffer layer, which is exclusively used by this invention. This is also proved by results of the XRD spectrum patterns being measured. Namely, comparison is made between the XRD spectrum patterns of sample 2 shown in FIG. 5 and the XRD spectrum patterns of comparative sample 2 shown in FIG. 6. As compared with comparative sample 2 (see FIG. 6), sample 2 (see FIG. 5) has a greater peak for $KNbO_3$ (001). Thus, it can be said that sample 2 is rich in crystallinity with respect to the KNbO3 (001) crystal. Similarly, comparison is made between sample 1 and comparative sample 1 with respect to the XRD spectrum patterns with reference to FIGS. 3 and 4. As compared with comparative sample 1 (see FIG. 4), sample 1 (see FIG. 3) has a greater peak for $KnbO_3$(020). Thus, it can be said that sample 1 is rich in crystallinity with respect to the $KnbO_3$(020) crystal. As described above, this invention proves that a $KNBO_3$ thin film can be formed with good crystallinity by way of a buffer layer formed from a class of materials expressed by a general chemical formula of $SrZO_3$. This contributes to increases of values in the values of the electromechanical coupling factor $K^2$.

(2) Second Examination

For a second examination, various samples were made in accordance with the configuration of the surface acoustic wave filter of the foregoing example 2 (see FIG. 2). Herein, the second examination was performed with respect to effects on the characteristics of the surface acoustic wave device using the temperature stabilization layer, which is specifically employed in example 2 of this invention. Actually, there are provided two samples, i.e., a comparative sample 7 corresponding to the foregoing sample 1, and a new sample 12 which is configured in accordance with example 2 as follows:

In sample 12, an amorphous $SiO_2$ film was formed as a temperature stabilization layer on sample 1 in accordance with the sputtering method using an $SiO_2$ target. Herein, the $SiO_2$ film has a film thickness of 1000 nm.

The aforementioned samples were evaluated with respect to several characteristics which include a temperature coefficient of frequency TCF in addition to the electromechanical coupling factor $K^2$ and insertion loss IL. Herein, measurement was performed for a frequency variation Δf of oscillation frequencies f of a delay-line oscillator in response to temperature variation ΔT of temperature T. Thus, the temperature coefficient of frequency TCF was calculated by an equation (5) as follows:

$$TCF = \frac{1}{f}\frac{\Delta f}{\Delta T} \tag{5}$$

The above equation shows that as the value of TCF becomes small, the sample becomes stabilized in temperature characteristics. Incidentally, the measurement was performed under a prescribed condition of a temperature range between 10° C. and 65° C.

FIG. 11 shows the specifications (or configurations) and evaluation results with respect to the aforementioned samples.

FIG. 11 shows that both sample 12 and comparative sample 7 have the same values for the electromechanical coupling factor $K^2$ and insertion loss IL. As compared with comparative sample 7, sample 12 is capable of remarkably reducing the temperature coefficient of frequency TCF because of the presence of the temperature stabilization layer. Therefore, it is proved that as compared with comparative sample 7, sample 12 having the temperature stabilization layer is capable of stabilizing temperature characteristics thereof.

As described heretofore, this invention has a variety of technical features and effects, which are summarized as follows:

(1) The surface acoustic wave device of this invention is configured using a buffer layer, which is made using perovskite compound crystal material which can be expressed by a general chemical formula of $SrZO_3$ having good lattice matching with a $KNbO_3$ single crystal. Thus, it is possible to form the $KNbO_3$ single crystal having good crystallinity. As a result, the surface acoustic wave device is capable of increasing the electromechanical coupling factor $K^2$. Thus, it is possible to manufacture surface acoustic wave devices which are capable of operating in broad bandwidths with high efficiencies.

(2) In manufacturing the surface acoustic wave devices, it is possible to form $KNbO_3$ piezoelectric layers with ease in accordance with the known thin film formation techniques such as a sol-gel processing method, laser abrasion method, sputtering method and CVD method. Thus, it is possible to reduce the costs of manufacturing surface acoustic wave devices to be lower than for manufacturing conventional devices.

(3) By further forming temperature stabilization layers on the $KNbO_3$ piezoelectric layers, it is possible to stabilize temperature characteristics of the surface acoustic wave devices.

As this invention may be embodied in several forms without departing from the spirit of the essential characteristics thereof, the present examples and samples described herein are therefore illustrative and not restrictive, since the scope of the invention is defined by the appended claims rather than by the description preceding them, and all changes that fall within the metes and bounds of the claims, or the equivalences of such metes and bounds are therefore intended to be embraced by the claims.

What is claimed is:

1. A surface acoustic wave device comprising:
a substrate made of at least one crystal compound that is selected from among SrTiO3, MgO, Pt, $Al_2O_3$, and GaAs;
a buffer layer made of a perovskite compound crystal formed on the substrate;
a piezoelectric layer made of a $KNbO_3$ single crystal formed on the buffer layer, wherein the $KNbO_3$ single crystal includes all planes containing an X-axis; and
an electrode layer formed on or below the piezoelectric layer.

2. A surface acoustic wave device according to claim 1 wherein the buffer layer is made of at least one crystal compound, which is selected from among $SrTiO_3$, $SrZrO_3$, $SrMoO_3$, $SrSnO_3$ and $SrHfO_3$.

3. A surface acoustic wave device according to claim 1, further comprising a $SiO_2$ layer that is formed over the piezoelectric layer.

4. A surface acoustic wave device comprising:
a substrate made of a bulk material, which allows growth of a perovskite compound crystal thereon, wherein the material forming the perovskite compound crystal can be expressed by the general chemical formula $SrZO_3$ (where Z denotes an element whose valence is 4);
a buffer layer made of the perovskite compound crystal formed on the substrate;
a piezoelectric layer made of a $KNbO_3$ single crystal formed on the buffer layer;
an electrode layer formed on or below the piezoelectric layer; and
a temperature stabilization layer formed over the piezoelectric layer and made of a material having a temperature coefficient reverse to a temperature coefficient of the piezoelectric layer so as to ease any distortion which may occur due to differences in thermal expansion between the piezoelectric layer and the electrode layer.

5. A surface acoustic wave device according to claim 4 wherein the $KNbO_3$ single crystal forming the piezoelectric layer includes all crystal planes containing an X-axis.

6. A surface acoustic wave device according to claim 4 wherein the buffer layer is made of at least one crystal compound, which is selected from among $SrTiO_3$, $SrZrO_3$, $SrMoO_3$, $SrSnO_3$ and $SrHfO_3$.

7. A surface acoustic wave device according to claim 4 wherein the bulk material for the substrate is made of at least one crystal compound, which is selected from among $SrTiO_3$, MgO, PT, $Al_2O_3$, GaAs and Si.

8. A surface acoustic wave device according to claim 5 wherein the buffer layer is made of at least one crystal compound, which is selected from among $SrTiO_3$, $SrZrO_3$, $SrMoO_3$, $SrSnO_3$ and $SrHfO_3$.

9. A surface acoustic wave device according to claim 5 wherein the bulk material for the substrate is made of at least one crystal compound, which is selected from among $SrTiO_3$, MgO, Pt, $Al_2O_3$, GaAs and Si.

10. A surface acoustic wave device according to claim 6 wherein the bulk material for the substrate is made of at least one crystal compound, which is selected from among $SrTiO_3$, MgO, Pt, $Al_2O_3$, GaAs and Si.

11. A surface acoustic wave device according to claim 4 wherein the material of the temperature stabilization layer is $SiO_2$.

12. A surface acoustic wave device according to claim 1 wherein an interdigital transducer is formed by patterning using a photolithography technique being effected on the electrode layer.

13. A surface acoustic wave device according to claim 4 wherein an interdigital transducer is formed by patterning using a photolithography technique being effected on the electrode layer.

14. A surface acoustic wave device according to claim 12 wherein the interdigital transducer is made of a material, which is selected from among Al, Ti, Au, Ag, W and Cu.

15. A surface acoustic wave device according to claim 13 wherein the interdigital transducer is made of a material, which is selected from among Al, Ti, Au, Ag, W and Cu.

16. A surface acoustic wave device according to claim 1 wherein the piezoelectric layer has a thickness, which is approximately 500 nm.

17. A surface acoustic wave device according to claim 4 wherein the piezoelectric layer has a thickness which is approximately 500 nm, while the temperature stabilization layer has a thickness which is approximately 1000 nm.

18. A surface acoustic wave device comprising:
    a substrate made of a bulk material;
    a $KNbO_3$ layer formed as a $KNbO_3$ single crystal over the substrate, wherein the $KNbO_3$ single crystal includes all crystal planes containing an X-axis;
    a first layer formed between the substrate and the $KNbO_3$ layer, wherein the bulk material of the substrate enables growth of the first layer, and wherein the first layer is made of at least one crystal compound that is selected from among $SrZrO_3$, $SrMoO_3$, $SrSnO_3$ and $SrHfO_3$; and
    an electrode formed on or below the $KNbO_3$ layer.

19. A surface acoustic wave device according to claim 18, wherein the substrate is made of at least one crystal compound that is selected from among $SrTiO_3$, $MgO$, $Pt$, $Al_2O_3$, $GaAs$, and $Si$.

20. A surface acoustic wave device according to claim 18 further comprising a second layer made of $SiO_2$ formed over the $KNbO_3$ layer.

21. A surface acoustic wave device comprising:
    a $KNbO_3$ (0) piezoelectric layer, wherein (0) represents all crystal planes including an X-axis;
    a buffer layer constituted by a perovskite compound allowing growth of $KNbO_3$ (0**);
    a substrate allowing growth of the buffer layer; and
    an electrode arranged above or below the $KNbO_3$ piezoelectric layer.

* * * * *